United States Patent
Koyama

Patent Number: 5,274,587
Date of Patent: Dec. 28, 1993

[54] NON-VOLATILE PROGRAMMABLE READ ONLY MEMORY DEVICE HAVING MEMORY CELLS EACH IMPLEMENTED BY A MEMORY TRANSISTOR AND A SWITCHING TRANSISTOR COUPLED IN PARALLEL AND METHOD OF MEMORIZING A DATA BIT

[75] Inventor: Shoji Koyama, Tokyo, Japan

[73] Assignee: NEC Corporation, Tokyo, Japan

[21] Appl. No.: 725,481

[22] Filed: Jul. 3, 1991

[30] Foreign Application Priority Data

Jul. 11, 1990 [JP] Japan .................. 2-184816

[51] Int. Cl.[5] .................. G11C 11/34; G11C 7/00
[52] U.S. Cl. .................. 365/185; 365/189.11; 365/218; 365/230.06; 257/314; 257/316; 257/324
[58] Field of Search .................. 365/185, 189.11, 218, 365/230.06; 257/314, 316, 324

[56] References Cited

U.S. PATENT DOCUMENTS

| | | | |
|---|---|---|---|
| 4,630,089 | 12/1986 | Sasaki et al. | 357/23.7 |
| 4,633,438 | 12/1986 | Kume et al. | 365/51 |
| 4,667,217 | 5/1987 | Janning | 357/54 |
| 5,060,034 | 10/1991 | Shimizu et al. | 257/314 |

FOREIGN PATENT DOCUMENTS

| | | |
|---|---|---|
| 0419663 | 4/1991 | European Pat. Off. |
| 0087876 | 5/1983 | Japan |
| 0206881 | 9/1987 | Japan |
| 0111316 | 11/1987 | Japan |
| 297056 | 4/1990 | Japan |
| WO9004855 | 5/1990 | PCT Int'l Appl. |

*Primary Examiner*—Rolf Hille
*Assistant Examiner*—David Ostrowski
*Attorney, Agent, or Firm*—Leydig, Voit & Mayer

[57] ABSTRACT

An electrically erasable and programmable read only memory device comprises a plurality of series combinations of memory cells arranged in rows and columns, bit lines each coupled to the front memory cells of the series combinations in one of the columns, a source line coupled to the rearmost memory cells of the plurality of series combinations, and word lines associated with the row of the memory cells, wherein each of the memory cells is implemented by a parallel combination of a floating gate type memory transistor and a switching transistor coupled to first and second word lines, respectively, so that any memory cell is rewriteable without simultaneous erasing operation on the series combination.

11 Claims, 7 Drawing Sheets

NON-VOLATILE PROGRAMMABLE READ ONLY MEMORY DEVICE HAVING MEMORY CELLS EACH IMPLEMENTED BY A MEMORY TRANSISTOR AND A SWITCHING TRANSISTOR COUPLED IN PARALLEL AND METHOD OF MEMORIZING A DATA BIT

FIELD OF THE INVENTION

This invention relates to a non-volatile programmable read only memory device and, more particularly, to the arrangement of a memory cell incorporated in an electrically erasable and programmable read only memory device.

DESCRIPTION OF THE RELATED ART

Electronic system composers are interested in non-volatile semiconductor memory devices capable of storing data bits without electric supply, and electrically erasable programmable read only memory devices have been progressively improved in compliance therewith. Various electrically erasable programmable read only memory devices are presently available, and used in electric and electronic system as important circuit components. One of the electrically erasable and programmable read only memory devices is proposed by R. Shitota et. al., Technical Digest of 1988 Symposium on VLSI Technology, pages 33 and 34, and Shirota's electrically erasable and programmable read only memory device is implemented by series combinations of memory transistors. FIG. 1 shows a typical example of the electrically erasable programmable read only memory device, and the memory transistors Qm11 to Qm13, Qm14 to Qm16, Qm21 to Qm23 and Qm24 to Qm26 are of the type having a floating gate and a controlling gate. Every three memory transistors are grouped and coupled in series between two switching transistors Qs11/Qs12, Qs13/Qs14, Qs21/Qs22 and Qs23/Qs24. The memory transistors Qm11 to Qm26 are arranged in matrix. Every three memory transistors Qm11 to Qm13, Qm14 to Qm16, Qm21 to Qm23 and Qm24 to Qm26 form a memory cell block. The switching transistors Qs11 and Qs13 are coupled to a bit line Y1, and a bit line Y2 is shared between the switching transistors Qs21 and Qs23 in the same column. All of the switching transistors Qs12, Qs22, Qs14 and Qs23 are coupled to a source line S, and the four memory blocks are coupled between the associated switching transistors Qs11, Qs13, Qs21 and Qs23 and the switching transistors Qs12, Qs14, Qs22 and Qs24, respectively. The switching transistors Qs11, Qs13, Qs21 and Qs23 are gated by first selecting signal lines D11 and D12, and the other switching transistors Qs12, Qs22, Qs14 and Qs24 are gated by second selecting signal lines D12 and D22. The controlling gates of the memory transistors Qm11 to Qm26 are coupled to word lines X1 to X6, and a data bit is read out from one of the memory transistors Qm11 to Qm26 to the associated bit line Y1 or Y2 in the form of voltage level due to current passing therethrough to the source line S.

A series of the memory transistors Qm11 to Qm13 associated with the switching transistors Qs11 and Qs12 are fabricated on a p-type single semiconductor chip 1 as shown in FIGS. 2 and 3. However, the bit line Y1 is deleted from the layout shown in FIG. 2 for the sake of simplicity. An active area assigned to the memory transistors Qm11 to Qm13 associated with the switching transistors Qs11 and Qs12 is selectively doped with n-type impurity atoms so that n-type impurity regions 1a to 1f provide source and drain regions of the component transistors Qm11 to Qm13, Qs11 and Qs12 at spacings. The n-type impurity region 1f further extends in perpendicular to the series combination of the memory transistors Qm11 to Qm13, and serves as the source line S. The active area is overlain by first gate oxide films, and the selecting lines D11 and D21 and floating gates FG are provided on the first gate oxide film. The floating gates FG are wrapped with second gate oxide films, and word lines X1 to X3 are held in contact with the second gate oxide films, respectively. An inter-level oxide film 2 covers the selecting lines D11 and D21 and the word lines X1 to X3, and a contact hole 2a is formed in the inter-level oxide film 2. The bit line Y1 passes through the contact hole 2a, and reaches the n-type impurity region 1a. The first gate oxide films under the floating gates FG are as thin as 90 angstroms, and, accordingly, allow tunneling current to pass therethrough. The current, which is called as "Fowler-Nordheim Tunneling Current", supplies electric charges to the floating gates FG for erasing data bits, and evacuates the electric charges from the floating gates FG for rewriting data bits.

The prior art electrically erasable and programmable read only memory device thus arranged selectively enters an erasing phase, a write-in phase and a read-out phase of operation, and behaves as follows. Description is focused upon the memory transistors Qm11 to Qm13 with reference to Table 1 where biasing conditions are summarized.

When the prior art electrically erasable and programmable read only memory device enters the erasing phase of operation, the bit line Y1 and the source line S are grounded, and the word lines X1 to X3 are elevated to a positive voltage level of 17 volts. Since the selecting lines D11 and D21 go to 5 volts, the switching transistors Qs11 and Qs12 simultaneously turn on, and propagate the ground voltage level to the memory transistors Qm11 to Qm13. Extremely strong electric field takes place across the first gate oxide films between the floating gates FG and the n-type impurity regions 1b to 1e, and electrons are injected into the floating gates FG. This results in elevation of the threshold level of the memory transistors Qm11 to Qm13. The elevated threshold level corresponds to the erased state. In the erasing phase of operation, the switching transistors Qs11 and Qs21 can not select any one of the memory transistors Qm11 to Qm13, and, for this reason, the erasing operation is simultaneously carried out on all of the memory transistors Qm11 to Qm13.

In the write-in phase of operation, one of the memory transistors Qm11 to Qm13 is designated by the associated word line X1, X2 or X3 of the ground voltage level, and other word lines closer to the bit line Y1 are elevated to a positive voltage level of 20 volts. However, the other word lines closer to the source line S are grounded. The bit line Y1 is elevated to the positive voltage level of 20 volts, and the ground voltage level reaches the drain region of the designated memory transistor, because the memory transistors closer to the bit line Y1 turn on in the presence of the positive voltage level of 20 volts regardless of the states. In other words, the memory transistors closer to the bit line Y1 merely serve as transfer gates, and no Fowler-Nordheim tunneling phenomenon takes place in the memory transistors closer to the bit line Y1. However, strong electric field takes place across the first gate oxide film of the designated memory transistor, and the electrons are evacuated from the floating gate to the associated n-type impurity region. This results in decay of the threshold level, and the low threshold level corresponds to the write-in state. No strong electric field is produced across the first gate oxide films of the other memory transistors closer to the source line S, because the positive voltage level of 20 volts is blocked by the designated memory transistor. Thus, the memory transistors Qm11 to Qm13 are selectively subjected to the write-in operation. In a case where the write-in operation is sequentially carried out on the memory transistors Qm11 to Qm13, the write-in operation is sequentially repeated from the memory transistor closest to the source line S to the memory cell located farthest therefrom. This sequence is desirable in view of protection of the write-in state from the strong electric field. However, the selecting line D21 remains in the ground voltage level, because the memory transistors already written allow current from the bit line Y1 to pass therethrough.

In the read-out phase, the bit line Y1 is kept in 1 volt, and the selecting lines D11 to D21 are fixed to 5 volts. The memory transistor to be accessed is designated by the associated word line of the ground voltage level, and the other word lines go up to 5 volts. Then, the memory transistors except for the accessed memory transistors serve as transfer gates, and voltage level on the bit line Y1 is changed depending upon the state of the accessed memory transistor. Namely, if the accessed memory transistor remains in the erased state, current from the bit line Y1 is blocked by the accessed memory transistor, because the threshold level thereof is elevated to a positive voltage level. On the other hand, if the write-in state is established in the accessed memory transistor, the threshold level thereof is in a negative voltage level, and the current passes through the series of the memory transistors Qm11 to Qm13 and the switching transistors Qs11 and Qs21. The current affects the voltage level on the bit line Y1, and the state of the access memory transistor is detectable by a certain peripheral circuit. In the prior art electrically erasable and programmable read only memory device, the threshold level of the memory transistors must be lower than the controlling voltage level as high as 5 volts.

TABLE 2

|  | (volt) | | | |
|---|---|---|---|---|
|  | Qm13 | Qm23 | Qm16 | Qm26 |
| Y1 | 20 | 10 | 20 | 10 |
| Y2 | 10 | 20 | 10 | 20 |
| D11 | 20 | 20 | 0 | 0 |
| D21 | 0 | 0 | 0 | 0 |
| D12 | 0 | 0 | 20 | 20 |
| D22 | 0 | 0 | 0 | 0 |
| X3 | 0 | 0 | 0 | 0 |
| X6 | 0 | 0 | 0 | 0 |

Since the memory transistors Qm13/Qm23 and Qm16/Qm26 belong to the third and sixth rows, the word lines X3 and X6 are shared therebetween, and, for this reason, each of the word lines X3 and X6 has no selectively between the memory transistors in the same row. However, the memory transistors in the same row are respectively associated with the bit lines Y1 and Y2, and selection between the memory transistors in the same row is achieved by the bit lines Y1 and Y2. For example, if the bit line Y1 is elevated to the positive voltage level of 20 volts remaining the bit line Y2 in an intermediate positive voltage level of 10 volts, the memory transistor Qm13 is allowed to enter the write-in state, however, the memory transistor Qm23 remains erased, because the electric field across the first gate oxide film of the memory transistor Qm23 is smaller than that of the memory transistor Qm13. Fowler-Nordheim tunneling current hardly flows across the first gate oxide films of the other memory transistors such as Qm21 and Qm22, and the memory transistors Qm21 and Qm22 are not erased, because the word lines X1 and X2 and the drain regions thereof are biased to 20 volts and 10 volts, respectively. The first selecting line D12 isolate the other memory blocks including Qm16 and Qm26 from the bit lines Y1 and Y2, and the word line X6 is biased to zero volt. This does not result in any change between the erased state and the write-in state. Thus, the prior art electrically erasable and programmable read only memory device needs the intermediate voltage level of 10 volts so as to prevent the non-selected memory transistor from unintentional write in operation.

Even if only zero and 20 volts are selectively applied to the bit lines Y1 and Y2, non-selected memory transis-

TABLE 1

|  | (volt) | | | | | | | |
|---|---|---|---|---|---|---|---|---|
| Mode SW. Tr. | Erase Non-Selective | Rewrite | | | Read-out | | | |
|  |  | Qm11 | Qm12 | Qm13 | Qm11 | Qm12 | Q13 |
| Y1 | 0 | 20 | 20 | 20 | 1 | 1 | 1 |
| D11 | 5 | 20 | 20 | 20 | 5 | 5 | 5 |
| X1 | 17 | 0 | 20 | 20 | 0 | 5 | 5 |
| X2 | 17 | 0 | 0 | 20 | 5 | 0 | 5 |
| X3 | 17 | 0 | 0 | 0 | 5 | 5 | 0 |
| D21 | 5 | 0 | 0 | 0 | 5 | 5 | 5 |
| S | 0 | 0 | 0 | 0 | 0 | 0 | 0 |

In Table 1, values are indicative of voltage level.

Subsequently, biasing conditions of the four memory blocks in the write-in state are described hereinbelow, and the memory transistors Qm13, Qm16, Qm23 and Qm26 are representative of the four memory blocks, respectively. Table 2 summarizes the biasing conditions of the four memory transistors Qm13, Qm16, Qm23 and Qm26.

tors are prevented from unintentional write-in state. However, it is impossible to prevent non-selected memory transistors coupled to a non-selected bit line from progressive erasing, and the threshold level of the non-selected memory transistors is gradually increased. Such a gradual increase of the threshold level is serious if the non-selected memory transistor is located closer to the associated bit line. If the memory block is implemented by a large number of memory transistors coupled in series, each component memory transistor is subjected to unintentional erasing as many as the write-in operations for the other component memory transistors. If the threshold level of the memory transistor in the write-in state exceeds the voltage level on the associated word line in the read-out phase of operation, the memory transistor is shifted from the write-in state to the erased state, and the piece of data information memorized therein is inverted in logic level.

Thus, in order to prevent the memory transistors in the write-in state from unintentional erasing, three kinds of voltage source, i.e., 20 volts, 10 volts and 5 volts, are necessary for the bit lines Y1 and Y2 of the prior art electrically erasable and programmable read only memory device shown in FIGS. 1 to 3. The three kinds of positive voltage control the Fowler-Nordheim tunneling phenomenon, and the high, intermediate and low positive voltage levels ranges from zero volt to 20 volts. If the intermediate voltage level is deviated toward either high or low positive voltage level, the intermediate voltage level is causative of unintentional shift between the erased state and the write-in state. In short, the first problem inherent in the prior art electrically erasable and programmable read only memory device is a small margin for the intermediate positive voltage level.

Another problem inherent in the prior art electrically erasable and programmable read only memory device is the unintentionally erasing. Even though the three kinds of positive voltage level are strictly controlled together with other biassing conditions, it is impossible to perfectly prevent the memory transistors from the unintentional erasing, because electric field is produced across the first gate oxide films of non-selected memory transistors.

Yet another problem relates to the Fowler-Nordheim tunneling current used in both write-in and erasing operations. The Fowler-Nordheim tunneling phenomenon takes place in the presence of a strong electric field, and the strong electric field is produced under an extremely thin first gate oxide film as well as an extremely large difference in voltage level. The large difference in voltage level needs the extremely high voltage level of 20 volts, and the first gate oxide film should be equal to or less than 100 angstroms. The component transistors exposed to the extremely high voltage level should be of a high-withstanding type, and the extremely thin first gate oxide films are much liable to have defects. Thus, the third and fourth problems inherent in the prior art electrically erasable and programmable read only memory device are complex process sequence and low production yield.

The fifth problem is prolonged programming sequence. Since the switching transistors Qs11, Qs13, Qs21 and Qs23 coupled have no selectivity, the memory transistors in a memory block is sequentially and selectively shifted to the write-in state after the simultaneous erasing operation on all of the memory transistors. Even if the previous state is established in some memory transistors again, the erasing operation and the writing operations are necessary for all of the memory transistors in a selected memory block, and the rewriting operation is undesirably prolonged. This results in poor applicability of the prior art electrically erasable and programmable read only memory device.

SUMMARY OF THE INVENTION

It is therefore an important object of the present invention to provide an electrically erasable and programmable read only memory device which is free from the problems inherent in the prior art electrically erasable and programmable read only memory device.

To accomplish the object, the present invention proposes to implement a memory cell by a parallel combination of a memory transistor and a switching transistor respectively associated with different word lines.

In accordance with the present invention, a non-volatile programmable read only memory device includes a plurality of memory cells grouped into a plurality of memory blocks and arranged in rows and columns. The plurality of memory blocks are arranged in rows and columns. The plurality of memory blocks have respective series combinations of the memory cells, each memory cell being implemented by a parallel connection of a memory transistor and a switching transistor. A plurality of bit lines are respectively associated with the columns of the plurality of memory cells and are respectively coupled to the parallel connections at first end positions of memory blocks disposed in associated columns. A source line is shared between the plurality of memory blocks and coupled to parallel connections at second end positions of the plurality of memory blocks opposite to the first end positions. A plurality of first word lines are respectively associated with the rows of the memory cells, and each of the plurality of first word lines are coupled to controlling gate electrodes of the memory transistors within an associated row. One of the first word lines is driven to select one of the memory cells from a selected memory block. A plurality of second word lines are respectively paired with the plurality of first word lines, and are respectively associated with the rows of the memory cells. Each of the plurality of second word lines are coupled to the switching transistors within an associated row. A second word line paired with the one of the first word lines is kept in an inactive level, while the other second word lines associated with the other memory cells of the selected memory block are driven to an active level. This arrangement allows the current to bypass the memory transistors associated with the other memory cells.

BRIEF DESCRIPTION OF THE DRAWINGS

The features and advantages of the electrically erasable and programmable read only memory device according to the present invention will be more clearly understood from the following description taken in conjunction with the accompanying drawings in which.

DESCRIPTION OF THE PREFERRED EMBODIMENTS

First Embodiment

Figure 1:
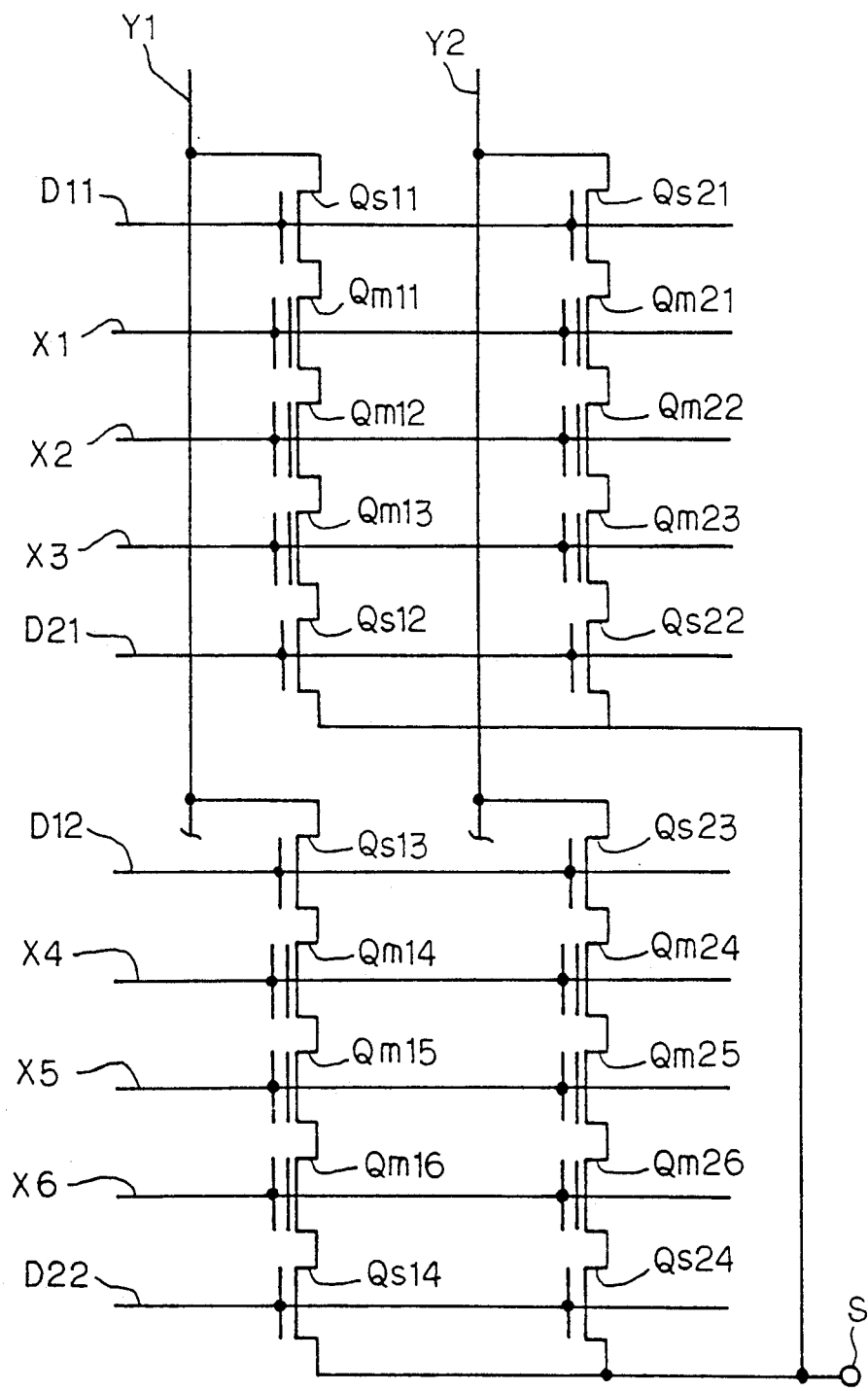
FIG. 1 is a circuit diagram showing the arrangement of a prior art memory cell array implemented by electrically erasable and programmable read only memory cells.
Figure 2:
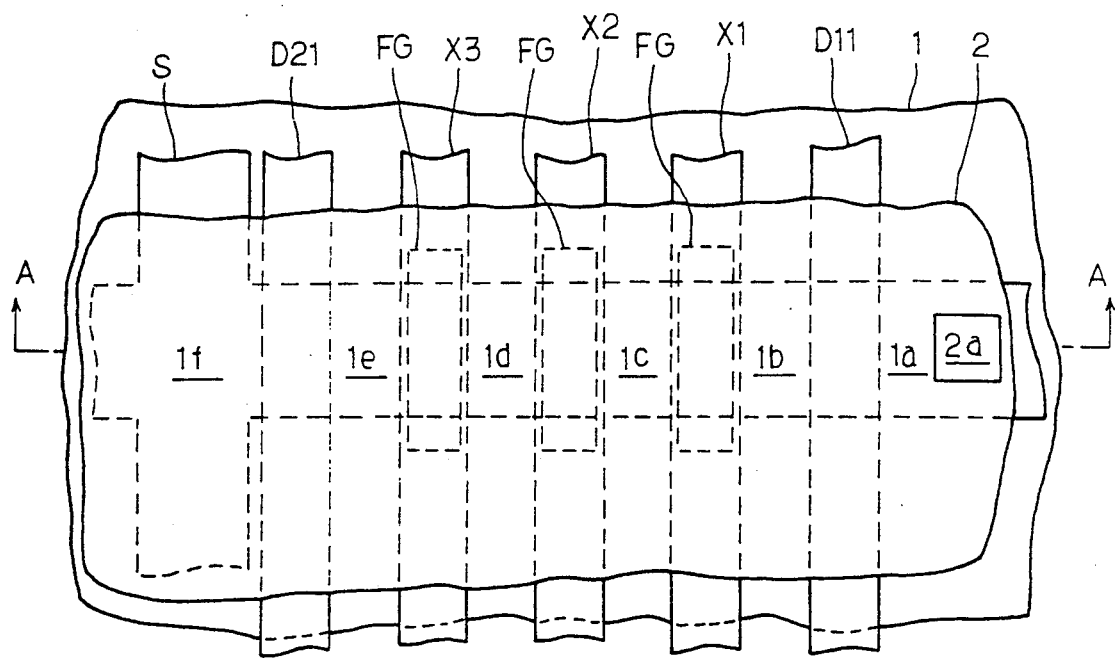
FIG. 2 is a plan view showing the layout of a part of the prior art memory cell array shown in FIG. 1.
Figure 3:
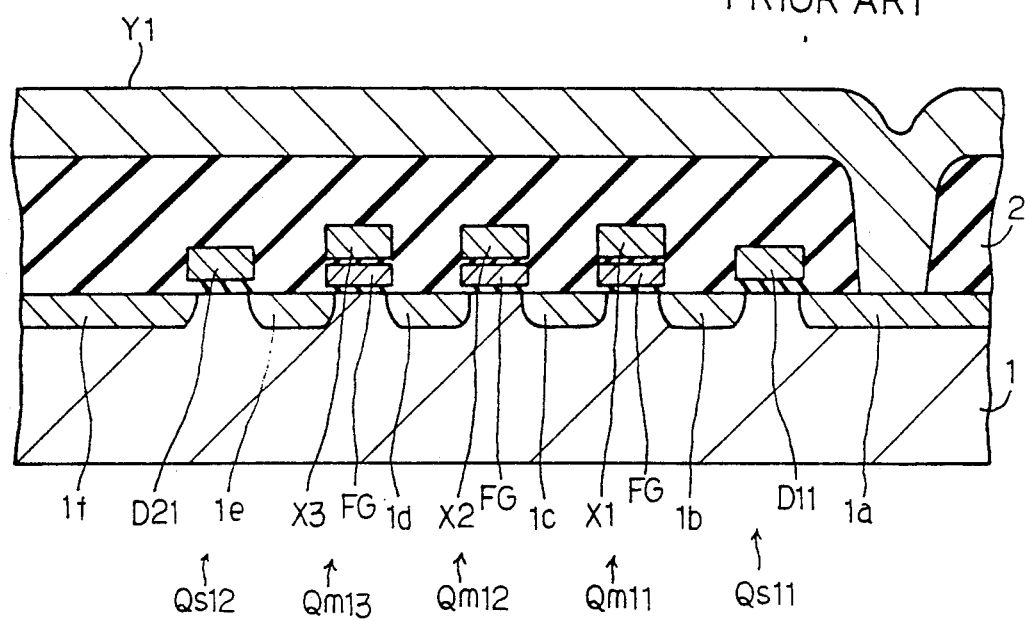
FIG. 3 is a cross sectional view taken along line A—A of FIG. 2 and showing the structure of the part of the prior art memory cell array.
Figure 4:
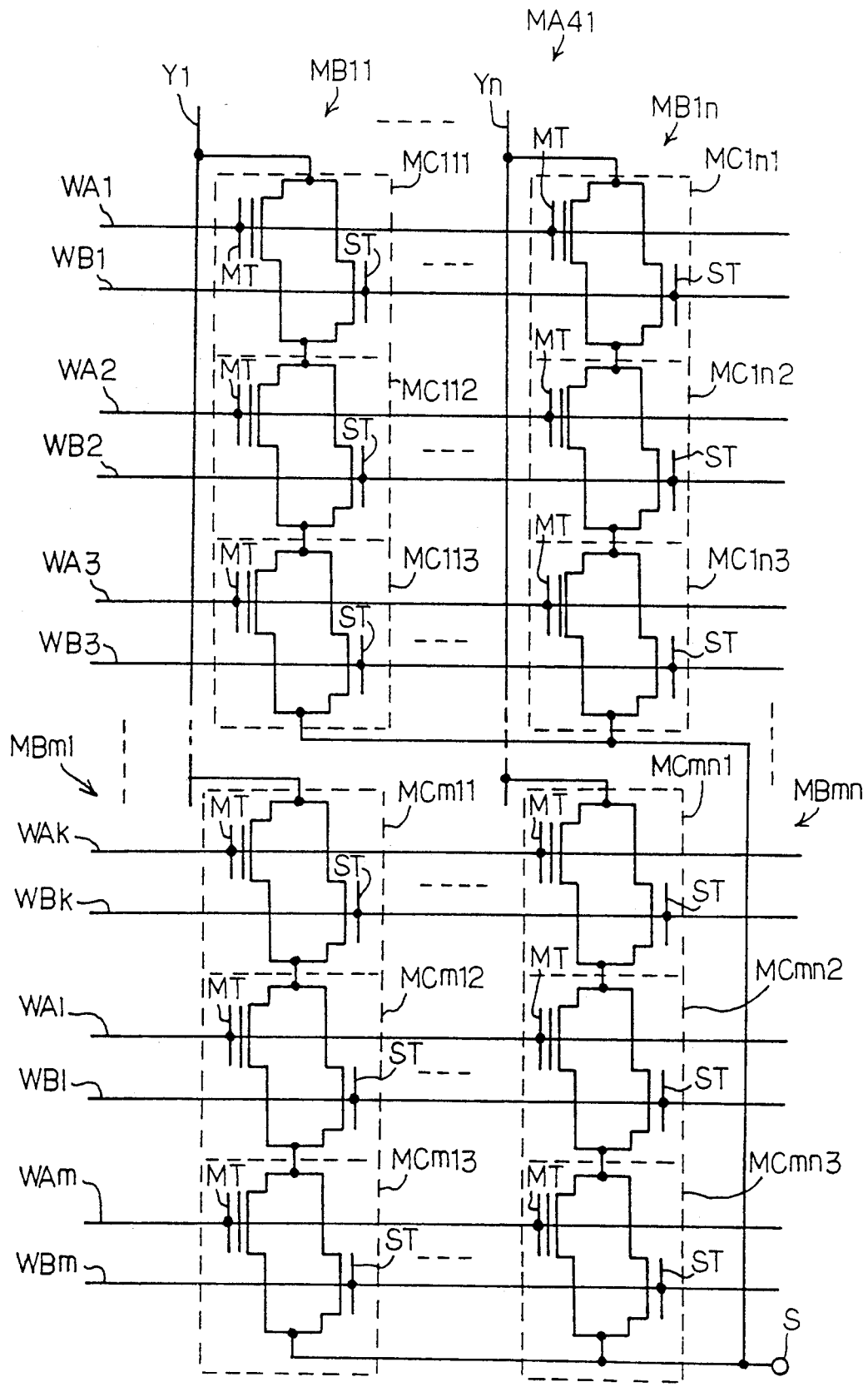
FIG. 4 is a circuit diagram showing the arrangement of memory blocks incorporated in an electrically erasable and programmable read only memory device according to the present invention.

Referring first to FIG. 4 of the drawings, a memory cell array MA41 incorporated in an electrically erasable and programmable read only memory device embodying the present invention has a plurality of memory blocks MB11, MB1n, MBm1 and MBmn arranged in rows and columns, a plurality of bit lines Y1 to Yn respectively associated with the columns of the memory blocks MB11 to MBmn for selecting one of the columns, and a plurality of first word lines WA1, WA2, . . . , WA3, WAk, WA1 and WAm respectively paired with a plurality of second word lines WB1, WB2, WB3, WBk, WB1 and WBm for forming a plurality of word line pairs. The plurality of word line pairs are respectively associated with the rows of the memory blocks MB11 to MBmn. Although the memory cell array MA41 is supported by various peripheral circuits, the peripheral circuits are not shown in FIG. 4 for the sake of simplicity, and the peripheral circuits may include a row address decoding circuit coupled to the bit lines, a column address decoding circuit, a word line driving circuit associated with the column address decoding circuit for selectively driving the first and second word lines WA1 to WAm and WB1 to WBm, a plurality of voltage sources associated with the bit lines Y1 to Yn and the bit line pairs for selectively supplying various positive voltage levels depending upon phase of operation, and a read-out circuit coupled to the bit lines Y1 to Yn for discriminating the logic level of a data bit read out from the memory cell array MA41. The read-out circuit may include a sense amplifier circuit.

Figure 5:
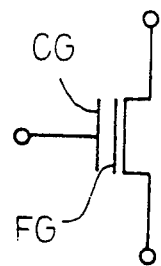
FIG. 5 is an equivalent circuit diagram of a memory transistor forming a part of the memory block shown in FIG. 4.

Each of the memory blocks MB11 to MBmn is implemented by a series combination of memory cells, and, accordingly, the matrix of the memory blocks MB11 to MBmn contains a plurality of memory cells MC111 to MC113, MC1n1 to MC1n3, MCm11 to MCm13 and MCmn1 to MCmn3 arranged in rows and columns. Each of the memory cells MC111 to MCmn3 is implemented by a parallel combination of a memory transistor MT and a switching transistor ST, and the bit lines Y1 to Yn are respectively coupled to the common nodes of the memory and switching transistors MT and ST at the front locations of the associated memory blocks MB11 to MBmn. The memory transistors are of the floating gate type having a controlling gate CG and a floating gate FG as shown in FIG. 5, and the switching transistors are of an n-channel type field effect transistor. The first word lines WA1 to WAm are coupled to the controlling gates of the associated memory transistors MT, and the switching transistors are gated by the associated second word lines WB1 to WBm. The rearmost memory cells MC113 to MCmn3 are coupled at the source nodes thereof to a source line S, and the source line S is grounded in this instance.

Figure 6:
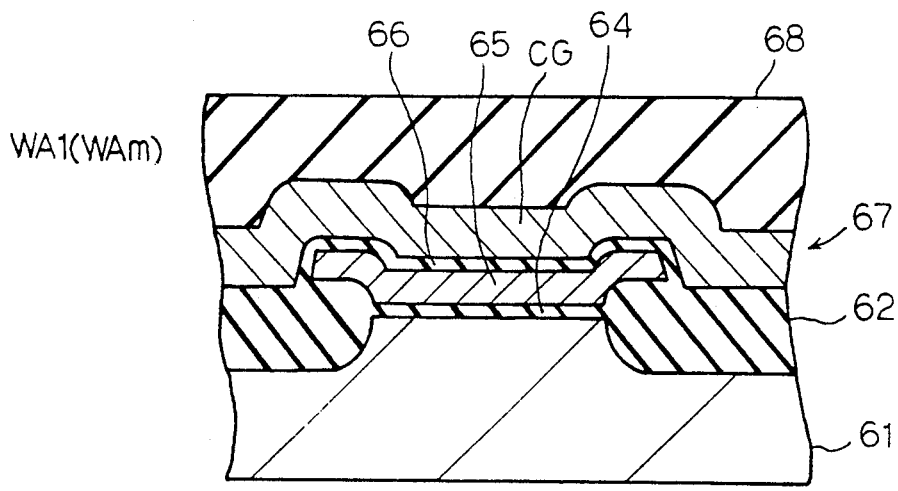
FIG. 6 is a cross sectional view showing the structure of the memory transistor shown in FIG. 5.
Figure 7:
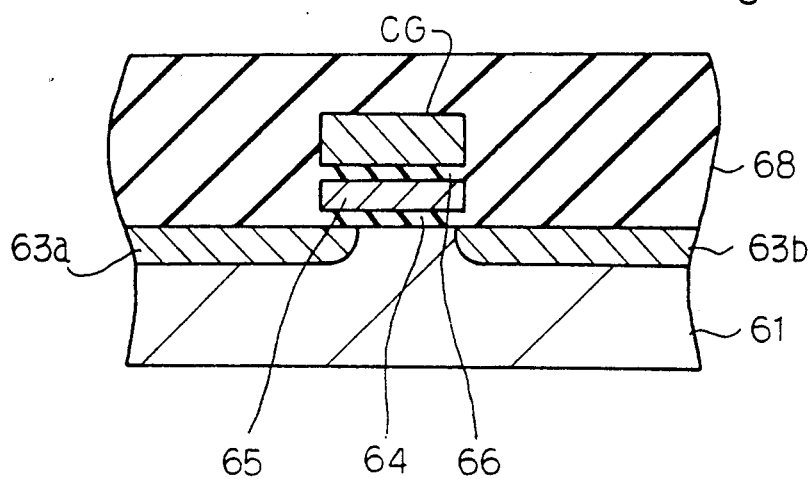
FIG. 7 is a cross sectional view showing the structure of the memory transistor from a different angle.

Turning to FIGS. 6 and 7, the memory transistor MT is fabricated on a p-type silicon substrate 61, and the resistivity of the p-type silicon substrate 61 is of the order of 13 ohm-cm. Though not shown in the drawings, the switching transistors ST and the component transistors of the peripheral circuits are also formed on the silicon substrate 61. On the major surface of the p-type silicon substrate 61 is selectively grown a thick field oxide film 62 which defines active areas for the memory cells MC111 to MCmn3 and the peripheral circuits. In this instance, the thick field oxide film 62 is of silicon dioxide and about 6000 angstroms in thickness. In the active areas, n-type impurity atoms are selectively doped so that shallow n-type impurity regions 63a and 63b are formed. The shallow n-type impurity regions 63a and 63b are about 0.3 micron in depth, and provide source and drain regions as well as the source line S. On the major surface between the source and drain regions 63a and 63b is grown a first gate oxide film 64 of silicon dioxide which is as thin as about 100 angstroms. The floating gate 65 of polysilicon doped with phosphorus is formed on the first gate oxide film 64, and is about 2000 angstroms in thickness. The floating gate 65 is covered with a second gate oxide film 66 of silicon dioxide, and the second gate oxide film 65 is regulated to about 300 angstroms in thickness. On the second gate oxide film 66 and the thick field oxide film 62 is patterned a polysilicon strip 67 doped with phosphorus which provides one of the first word lines WA1 to WAm and the controlling gate CG merged into the associated word line. The polysilicon strip 67 is about 4000 angstroms in thickness, and is covered with an inter-level insulating film 68 of boro-phosphosilicate glass. The inter-level insulating film 68 is about 4000 thick.

The electrically erasable and programmable read only memory device according to the present invention selectively enters a erasing phase, a write-in phase and a read-out phase, and a rewriting operation is achieved through the erasing phase and the write-in phase. In this instance, if hot electrons are injected into the floating gate FG, the memory transistor enters a write-in state, and the memory cell is recovered to an erased state upon evacuation of electrons. When the memory transistor enters the write-in state, the threshold level thereof is elevated from that in the erased state, and the relation between the threshold level and the state of the memory transistor is opposite to the prior art memory transistor. However, the relation between the threshold level and the state of the memory transistor depends on the peripheral circuit such as the read-out circuit, and is, therefore, reversible.

As described hereinbefore, if hot electrons are injected into the floating gate FG, the memory transistor MT enters the write-in state. When a write-in operation is sequentially carried out for the memory cells MC111, MC112, MC113, MC1n1, MCm12 and MCmn2, the bit lines Y1 and Yn, the first and second word lines WA1, WB1, WA2, WB2, WA3, WB3, WA1 and WB1 and the source line S are selectively driven to the voltage levels summarized in Table 3.

Namely, in order to cause the memory cell MC111 to enter the write-in state, the drain node of the memory transistor MT is supplied with 6 volts from the associated bit line Y1, and the first word line WA1 and, accordingly, the controlling gate CG go up to 10 volts. However, the second word line WB1 remains in the ground level, and the switching transistor ST of the memory cell turns off so as to block the positive voltage level of 6 volts. The other first word lines WA2 to WA3 remain in the ground level, and, on the contrary, the other second word lines WB2 and WB3 are elevated to 10 volts for allowing the switching transistors ST of the memory cells MC112 and MC113 to turn on. In this situation, the memory transistor MT of the memory cell MC111 is coupled at the drain node thereof to the bit line Y1 and at the source node thereof to the source line S through the switching transistors ST of the memory cells MC112 and MC113, and current flows from the bit line Y1 through the memory transistor MT of the memory cell MC111 to the source line S. The current thus flowing through the memory transistor MT produces hot electrons, and the hot electrons are attracted to the floating gate FG in the presence of electric field produced by the positive voltage level of 10 volts at the controlling gate CG. This results in that the hot electrons are accumulated in the floating gate FG, and the memory transistor MT of the memory cell MC111 enters the write-in state. Hot electrons are hardly produced in the other memory transistors MT of the memory block MB11, and, accordingly, remain in the respective previous states, because the resistance of each memory transistor MT applied with the ground voltage level is much larger than the associated switching transistor ST applied with the positive voltage level of 10 volts. However, the other first and second word lines WAk to WAm and WBk to WBm remain in the ground voltage level, and no current flows from the bit line Y1 through the memory block MCm11 to the source line S. Since another bit line Yn remains in the ground voltage level, no current flows through the other memory blocks MB1n to MBmn, and any memory transistor never enters the write-in state.

Similarly, when the memory cell MC111 is shifted to the write-in state, the first word line WA2 goes up to 10 volts, the second word line WB2 goes down to the ground voltage level, the first word lines WA1 and WA3 remain in the ground voltage level, and the second word lines WB1 and WB3 are elevated to 10 volts. Then, only one current path is provided from the bit line Y1 through the switching transistor ST of the memory cell MC111, the memory transistor MT of the memory cell MC112 and the switching transistor ST of the memory cell MC113 to the source line S. Hot electrons produced by the current are injected into the floating gate FG of the memory transistor MT of the memory cell MC112, and the memory transistor MT of the memory cell MC112 enters the write-in state.

TABLE 3

| Memory Cell | MC111 | MC112 | MC113 | MC1n1 | MCm12 | MCmn2 |
|---|---|---|---|---|---|---|
| Y1  | 6  | 6  | 6  | 0  | 6  | 0 |
| Yn  | 0  | 0  | 0  | 6  | 0  | 6 |
| WA1 | 10 | 0  | 0  | 10 | 0  | 0 |
| WB1 | 0  | 10 | 10 | 0  | 0  | 0 |
| WA2 | 0  | 10 | 0  | 0  | 0  | 0 |
| WB2 | 10 | 0  | 10 | 10 | 0  | 0 |
| WA3 | 0  | 0  | 10 | 0  | 0  | 0 |
| WB3 | 10 | 10 | 0  | 10 | 0  | 0 |
| WA1 | 0  | 0  | 0  | 0  | 10 | 10 |
| WB1 | 0  | 0  | 0  | 0  | 0  | 0 |
| S   | 0  | 0  | 0  | 0  | 0  | 0 |

Values in Table 3 are voltage levels on the respective lines.

An erasing operation can be carried out in association with one of the associated bit line and the source line S, and the erasing operation has two different modes, i.e., a simultaneous erasing and selective erasing. All of the memory transistors of the memory cell array MA41 are simultaneously erased through the simultaneous erasing operation, and all of the memory transistors MT coupled to a selected first word line are erased through the selective erasing operation. The erasing operation from the source line S is summarized in Table 4A, and the lines are regulated as shown in FIG. 4B in the erasing operation from the associated bit line. In both cases, when a positive high voltage level of, for example, 18 volts is applied to either source or drain region 63a or 63b in the presence of the ground voltage level on the controlling gate CG, strong electric field takes place in the first gate oxide film 64, and the electrons are evacuated from the floating gate FG through the Fowler-Nordheim tunneling. For this reason, one of the n-type impurity regions 63a and 63b is partially overlapped with the floating gate for allowing the Fowler-Nordheim tunneling phenomenon to take place. The partially overlapped structure is conducive to improvement of high withstand voltage at the drain node.

If the source line S is used for the erasing operation, the n-type impurity region 63a or 63b on the source side is partially overlapped with the floating gate FG. As shown in Table 4A, in the simultaneous erasing, the first word lines WA1 to WA3 have no selectivity, and, for this reason, all of the first word lines WA1 to WAm remain in the ground voltage level. However, all of the second word lines WB1 to WBm are elevated to 20 volts in this instance. The source line S goes up to 20 volts, and the bit lines Y1 to Yn are in open-state. Then, all of the switching transistors ST turn on to propagate the positive high voltage level of 20 volts to the source/drain regions of the memory transistors MT. The electrons accumulated in the floating gates FG are evacuated to the source line S, and all of the memory transistors MT of the memory cell array MA41 enter the erased state.

If, on the other hand, the selective erasing is designated, only a selected first word line remains in the ground voltage level, and the other first word lines as well as all the second word lines WB1 to WBm are elevated to the positive high voltage level of 20 volts. The source line S goes up to the positive high voltage level of 20 volts, and the bit lines Y1 to Yn are open. The positive high voltage level of 20 volts is distributed from the source line S through the switching transistors ST to the source and drain regions of the memory transistors MT. The Fowler-Nordheim tunneling takes place in the memory transistors MT coupled to the selected first word line due to strong electric field produced by the large difference in voltage level between the source and drain regions and the grounded controlling gate CG. However, no Fowler-Nordheim tunneling takes place in the other memory transistors, because the electric field is negligible between the source and drain regions and the controlling gates CG. Thus, the electrically erasable and programmable read only memory device according to the present invention has the selectivity between the word line pairs, and, for this reason, a programmer can rewrite data bits into the memory cells. This is conducive to reduction of time period consumed by the programming.

Even if the bit lines Y1 to Yn are used for the erasing operation, the n-type impurity region 63a or 63b on the bit line side is partially overlapped with the floating gate FG, and the simultaneous erasing and the selective erasing are selectively carried out. In the simultaneous erasing, all of the first word lines WA1 to WAm remain in the ground voltage level. However, all of the second word lines WB1 to WBm are elevated to 20 volts. All of the bit lines Y1 to Yn go up to 20 volts, and the source line S is open. Then, all of the switching transistors ST turn on to propagate the positive high voltage level of 20 volts to the source/drain regions of the memory transistors MT. The electrons accumulated in the floating gates FG are evacuated to the bit lines Y1 to Yn, and all of the memory transistors MT of the memory cell array MA41 simultaneously enter the erased state.

On the other hand, when the selective erasing is designated, only a selected first word line remains in the ground voltage level, and the other first word lines as well as all the second word lines WB1 to WBm are elevated to the positive high voltage level of 20 volts. All of the bit lines Y1 to Yn go up to the positive high voltage level of 20 volts, and the source line S is open. The positive high voltage level of 20 volts is distributed from the bit lines Y1 to Yn through the switching transistors ST to the source and drain regions of the memory transistors MT. The Fowler-Nordheim tunneling takes place in the memory transistors MT coupled to the selected first word line due to strong electric field produced by the large difference in voltage level between the source and drain regions and the grounded controlling gate CG. However, no Fowler-Nordheim tunneling takes place in the other memory transistors, because the electric field is negligible between the source and drain regions and the controlling gates CG. Thus, the electrically erasable and programmable read only memory device according to the present invention also has the selectivity between the word line pairs.

Figure 8:
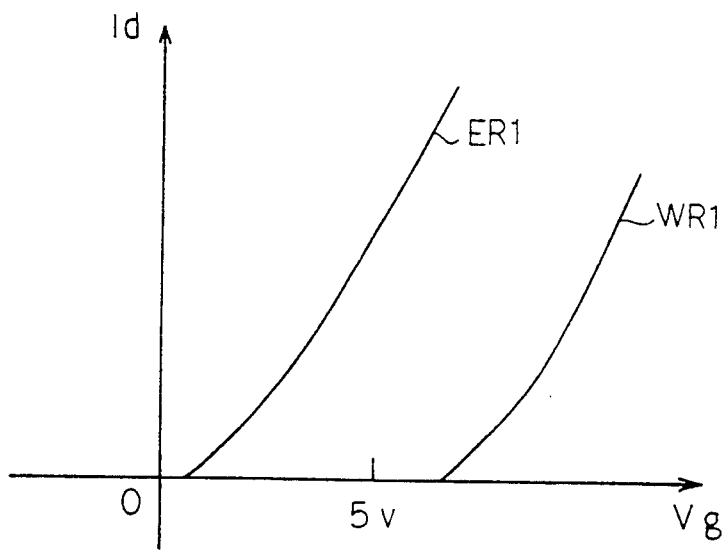
FIG. 8 is a graph showing drain current in terms of gate voltage level applied to the controlling gate of a memory cell incorporated in the electrically erasable and programmable read only memory device shown in FIG. 4.

The erasing operation and the write-in operation affect the threshold level of the memory cell, and FIG. 8 shows the voltage-to-current characteristics of the memory cell. Plots WR1 is indicative of the drain current Id in terms of the voltage level Vg at the controlling gate CG after the write-in operation, and plots ER1 stand for the memory cell in the erased state. As will be understood from plots WR1 and ER1, the drain current Id is decreased after the write-in operation in so far as the voltage level Vg at the controlling gate CG is constant. In other words, if the controlling gate CG goes up to, for example, 5 volts in the read-out phase, a memory cell in the erased state allows current to flow, however, no current flows in a memory cell in the write-in state.

Figure 9:
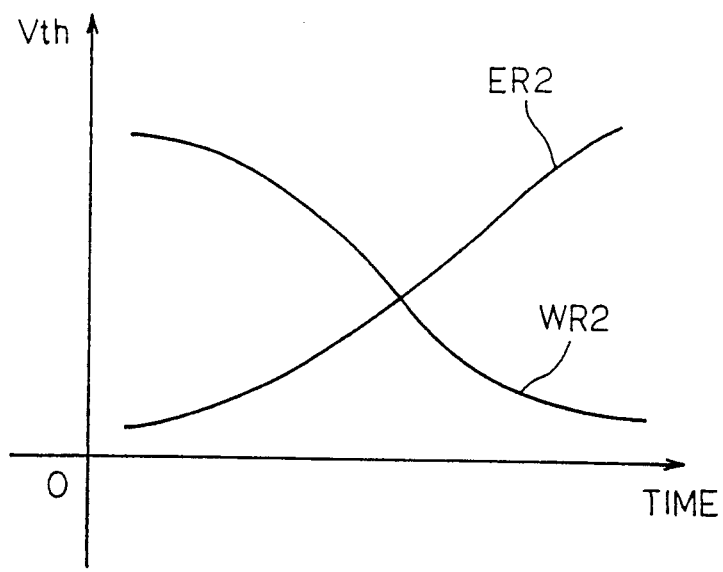
FIG. 9 is a graph showing the aged deteriorations in threshold level after both write-in and erasing operations.

The memory cells according to the present invention are subjected to aged deterioration, and the threshold level Vth of the memory cell is varied as indicated by plots WR2 and ER2 of FIG. 9. In the erased state memory cell, the threshold level Vth is gradually increased, and the write-in state traces the down sloop. However, such an aged deterioration needs an extremely long time period, and the electrically erasable and programmable read only memory device according to the present invention has encounters no problem in an actual service time period.

TABLE 4a

| Mode Selectivity | (volt) Simultaneous Erase Non | Selective Erase | | |
|---|---|---|---|---|
| | | WA1 | WA2 | WA3 |
| WA1 | 0 | 0 | 20 | 20 |
| WB1 | 20 | 20 | 20 | 20 |
| WA2 | 0 | 20 | 0 | 20 |
| WB2 | 20 | 20 | 20 | 20 |
| WA3 | 0 | 20 | 20 | 0 |
| WB3 | 20 | 20 | 20 | 20 |
| WAk to WAm | 0 | 20 | 20 | 20 |
| WBk to WBm | 20 | 20 | 20 | 20 |
| Y1 | open | open | open | open |
| Yn | open | open | open | open |
| S | 20 | 20 | 20 | 20 |
| WA1 | 0 | 0 | 20 | 20 |
| WB1 | 20 | 20 | 20 | 20 |
| WA2 | 0 | 20 | 0 | 20 |
| WB2 | 20 | 20 | 20 | 20 |
| WA3 | 0 | 20 | 20 | 0 |
| WB3 | 20 | 20 | 20 | 20 |
| WAk to WAm | 0 | 20 | 20 | 20 |
| WBk to WBm | 20 | 20 | 20 | 20 |
| Y1 | 20 | 20 | 20 | 20 |
| Yn | 20 | 20 | 20 | 20 |
| S | open | open | open | open |

Values in Tables 4A and 4B are voltage levels in the lines.

When the electrically erasable and programmable read only memory device according to the present invention enters the read-out phase of operation, the bit lines Y1 to Yn, the first and second word lines WA1 to WAm and WB1 to WBm and the source line S are controlled as shown in Table 5 depending upon a memory cells to be accessed. Upon access to a memory cell, the associated first word line is elevated to 5 volts, but the second word line paired thereto remains in the ground voltage level. The other second word lines coupled to the other memory cells of the same memory block go up to 5 volts, and, for this reason, a current path is established between the associated bit line to the source line S. The associated bit line goes up to 1 volt, and the other bit lines remain in the ground voltage level. Then, if the accessed memory cell is in the erased state, the memory transistor MT turns on, and current flows from the associated bit line through the memory block to the source line S. However, if a memory cell in the write-in state is accessed, the memory transistor MT remains off, and no current flows from the associated bit line to the source line S. The read-out circuit (not shown) detects the current, and produces an output data signal indicative of the stated of the accessed memory cell. The first word lines coupled to the memory cells in the same memory block is either zero or 5 volts, because the switching transistors ST provide the current path. Thus, the voltage level on the non-selected first word lines is arbitrary. However, the other first and second word lines associated with the non-selected memory blocks are kept in the ground voltage level, and the non-selected memory blocks are cut from the associated bit lines and the source line S. In this instance, the threshold level of the memory transistors MT is fallen in the positive voltage range at all times.

If the read-out circuit is shared between all of the bit lines Y1 to Yn, only one memory cell is accessed in a single read-out operation. However, if a plurality of read-out circuits are respectively associated with the bit lines Y1 to Yn, a plurality of memory cells are simultaneously accessed, and the associated bit lines Y1 to Yn are concurrently elevated to 1 volts as will be seen from the column "MC111 & MC1n1" in Table 5.

As will be understood from the foregoing description, the electrically erasable and programmable read only memory device embodying the present invention allows the memory cells MC111 to MCmn3 to selectively enter the erased state, and no extremely high positive voltage level of 20 volts is used in the write-in phase because of the switching transistors ST respectively coupled in parallel to the memory transistors MT. The write-in operation without any extremely high positive voltage level decreases the high-withstand component transistors, and the injection of hot electrons increases the first gate oxide films. This results in simplification of process sequence and in high productivity of the electrically erasable and programmable read only memory device according to the present invention.

TABLE 5

| Accessed Cell | (volt) | | | | MC111 & |
|---|---|---|---|---|---|
| | MC111 | MC112 | MC113 | MC1n1 | MC1n1 |
| Y1 | 1 | 1 | 1 | 0 | 1 |
| Y2 | 0 | 0 | 0 | 1 | 1 |
| WA1 | 5 | 0 (5) | 0 (5) | 5 | 5 |
| WB1 | 0 | 5 | 5 | 0 | 0 |
| WA2 | 0 (5) | 5 | 0 (5) | 0 (5) | 0 (5) |
| WB2 | 5 | 0 | 5 | 5 | 5 |
| WA3 | 0 (5) | 0 (5) | 5 | 0 (5) | 0 (5) |
| WB3 | 5 | 5 | 0 | 5 | 5 |
| WAk to WAm | 0 | 0 | 0 | 0 | 0 |
| WBk to WBm | 0 | 0 | 0 | 0 | 0 |
| S | 0 | 0 | 0 | 0 | 0 |

Values in Table 5 are indicative of voltage levels.

Second Embodiment

Figure 10:
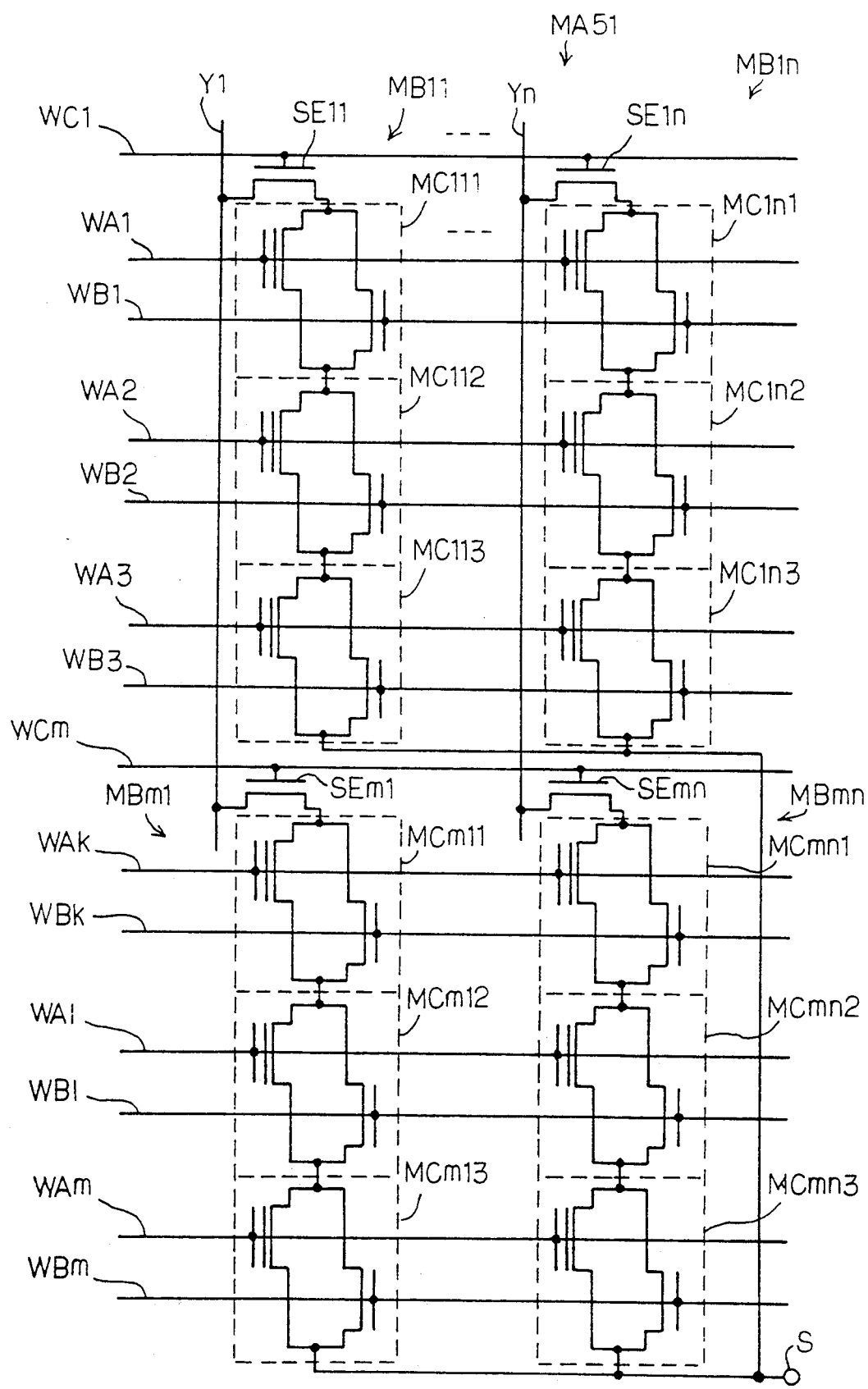
FIG. 10 is a circuit diagram showing the arrangement of a memory cell array incorporated in another electrically erasable and programmable read only memory device according to the presence invention.

Turning to FIG. 10, a memory cell array MA51 incorporated in another electrically erasable and programmable read only memory device is illustrated. The memory cell array MA51 is similar in arrangement to the first embodiment except for selecting transistors SE11, SE1n, SEm1 and SEmn, and, for this reason, the other component elements and lines are labeled with the same references as those used in the first embodiment. The selecting transistors SE11 to SEmn are of the n-channel field effect transistor, and are coupled between the associated bit lines Y1 to Yn and the common drain nodes of the front memory cells MC111, MC1n1, MCm11 and MCmn1, respectively. Third word lines WC1 to WCm are associated with the rows of the selecting transistors SE11 to SEmn, and are coupled to the gate electrodes of the selecting transistors SE11 to SEmn. The third word lines WC1 to WCm are selectively elevated to 5 volts in the write-in phase, and the selecting transistors SE11 to SEmn coupled thereto turn on. Only one memory block is selected from each column, and the selecting transistors in off-state prevent the bit line from leakage current passing through on-selected memory blocks. Thus, the selecting transistors SE11 to SEmn improve the programming in the write-in phase.

Figure 11:
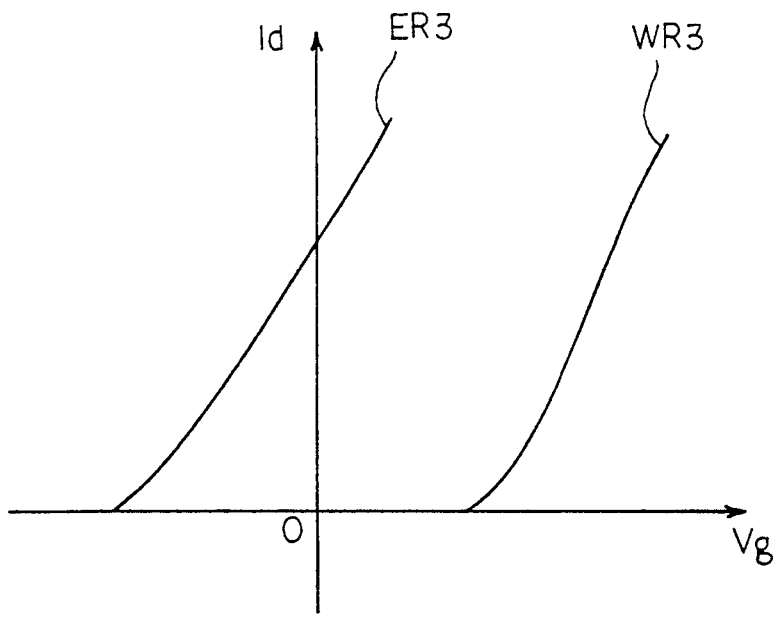
FIG. 11 is a graph showing drain current in terms of gate voltage level applied to the controlling gate of a memory cell incorporated in the electrically erasable and programmable read only memory device shown in FIG. 10.
Figure 12:
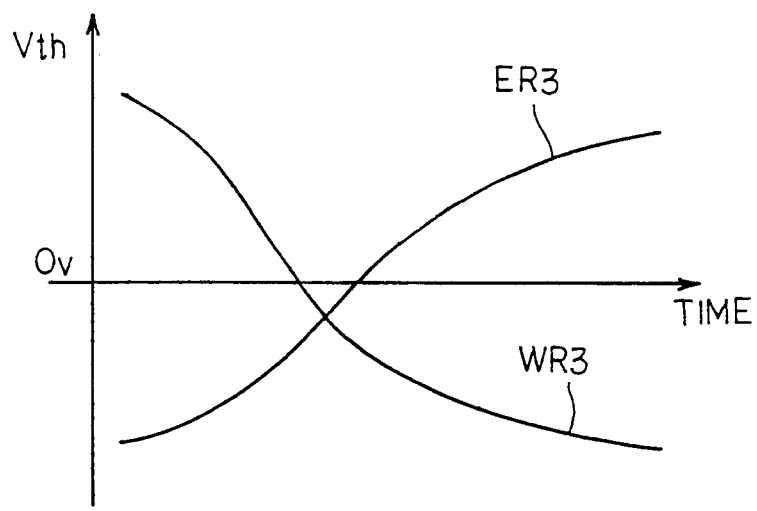
FIG. 12 is a graph showing the aged deteriorations in threshold level after both write-in and erasing operations.

Since the selecting transistors SE11 to SEmn selectively cut off current paths from the bit lies Y1 to Yn to the memory blocks MB11 to MBmn in the read-out phase, depletion mode memory transistors MT in the erased state, which provide respective conductive channels therein under zero volt at the controlling gate CG, never affect the read-out phase of operation. If the erased state corresponds to the depletion mode, the voltage-to-current characteristics of the memory transistor MT trance plots ER3 and WR3 of FIG. 11, and the threshold level Vth of the memory transistor MT is varied as shown in FIG. 12 due to aged deterioration. In FIGS. 11 and 12, plots ER3 and WR3 stand for the erased state and the write-in state, respectively.

The electrically erasable and programmable read only memory device implementing the second embodiment selectively enters the erasing phase, the write-in phase and the read-out phase. The voltage levels on the third word lines WC1 to WCm in the three states are summarized in Table 6.

TABLE 6

| | (volt) | | | |
|---|---|---|---|---|
| Selected Cell | MC111 to MC113 MC1n1 to MC1n3 | | MCm11 to MCm13 MCmn1 to MCmn3 | |
| Third Word line | WC1 | WCm | WC1 | WCm |
| Read-out | 5 | 0 | 0 | 5 |
| Write-in | 20 | 0 | 0 | 20 |
| ERASE | | | | |
| Fr. Source line | 0 | 0 | 0 | 0 |
| Fr. Bit lines | 20 | 0 | 0 | 20 |

The third word lines WC1 to WCm are selectively elevated to 5 volts in the read-out phase, and an extremely high positive voltage level of, for example, 20 volts are selectively supplied to the write-in phase and the erasing phase carried out by using the bit lines Y1 to Yn. However, the third word lines WC1 to WCm remains in the ground voltage level in the erasing phase carried out from the source line S.

The voltage levels in the read-out phase are shown in Table 7, however, the detailed description is omitted for avoiding repetition. As described hereinbefore, the memory transistor MT in the erased state allows current to flow therethrough under zero volt on the associated first word line, however, no current flows through the memory transistor in the write-in state under zero volt on the associated first word line. The current is detectable by a sense amplifier circuit of a read-out circuit (not show) as similar to the first embodiment. Since zero volt on the selected first word line can check the state of the access memory cell, a wide voltage range is left for the threshold level of the memory transistor MT and the read-out voltage level on the first word line.

The read-out voltage level is so low that the electrically erasable and programmable read only memory device shift the threshold level of the memory transistor smaller than that of the first embodiment. This means that the voltage level on the first word line in the write-in phase is lower than that of the first embodiment. The lower write-in voltage level is desirable for the non-selected memory transistors coupled to the same first word line, because the Fowler-Nordheim tunneling current hardly takes place therein, and, accordingly, are free from unintentional write-in state. Moreover, even if the memory transistor MT is unintentionally and excessively erased, no problem is encountered in the electrically erasable and programmable read only memory device implementing the second embodiment, because the second embodiment allows the memory transistor in the erased state to enter the depletion mode. Thus, the electrically erasable and programmable read only memory device implementing the second embodiment is free from the excessive erasing and excessive write-in, and this feature improves the manipulability of the device.

TABLE 7

| Accessed Cell | MC111 | MC112 | MC113 | MC1n1 | MCm11 | MCmn1 |
|---|---|---|---|---|---|---|
| Y1 | 1 | 1 | 1 | 0 | 1 | 0 |
| Y2 | 0 | 0 | 0 | 1 | 0 | 1 |
| WC1 | 5 | 5 | 5 | 5 | 0 | 0 |
| WCm | 0 | 0 | 0 | 0 | 5 | 5 |
| WA1 | 0 | 5 (0) | 5 (0) | 0 | 0 | 0 |
| WB1 | 0 | 5 | 5 | 0 | 0 | 0 |
| WA2 | 5 (0) | 5 | 5 (0) | 5 (0) | 5 (0) | 5 (0) |
| WB2 | 5 | 0 | 5 | 5 | 5 | 5 |
| WA3 | 5 (0) | 5 (0) | 0 | 5 (0) | 5 (0) | 5 (0) |
| WB3 | 5 | 5 | 0 | 5 | 5 | 5 |
| WAk to WAm | 0 | 0 | 0 | 0 | 0 | 0 |
| WBk to WBm | 0 | 0 | 0 | 0 | 0 | 0 |
| S | 0 | 0 | 0 | 0 | 0 | 0 |

Values in Table 7 are indicative of voltage levels.

As will be understood from the foregoing description, the electrically erasable and programmable read only memory device according to the present invention is firstly advantageous over the prior art in that any simultaneous erasing operation on all of the memory cells in the selected memory block is unnecessary before programming.

Second, only two positive voltage levels are used in the selective write-in operation, and the peripheral circuits are simplified rather than that of the prior art device.

Third, each memory cell is conducted to the associated bit line and the source line through the switching transistors, and unintentional write-in state hardly takes place. If the memory transistors are allowed to behave in the depletion mode as the second embodiment, the memory transistor is free from not only the unintentional write-in state but also unintentional erased state. This results in wide range for the write-in state and the erased state.

Fourth, since hot electrons are used for the write-in operation, electric field across the first gate oxide film is decreased rather than that using the Fowler-Nordheim tunneling current. The low write-in voltage on the selected first word line prevents the non-selected memory transistors coupled thereto from unintentional write-in state. If the write-in voltage level is further decreased as in the second embodiment, no high-withstand component transistor is necessary for the word line driving circuit, and the word line driving circuit is easily designed.

Finally, if the erasing operation is carried out through ultra-violet radiation or avalanche break-down, the first gate oxide film is increased, and the memory transistor with thick first gate oxide film improves the production yield.

Although particular embodiments of the present invention have been shown and described, it will be obvious to those skilled in the art that various changes and modifications may be made without departing from the spirit and scope of the present invention. For example, each of the memory blocks MB11 to MBmn may contain more than three memory cells coupled in series. The memory transistors and the associated switching transistors may be of the p-channel type.

What is claimed is:

1. A non-volatile programmable read only memory device comprising:
    a) a plurality of memory cells grouped into a plurality of memory blocks and arranged in rows and columns, said plurality of memory blocks having respective series combinations of said memory cells each implemented by a parallel connection of a memory transistor and a switching transistor;
    b) a plurality of bit lines respectively associated with the columns of said plurality of memory cells and respectively coupled to said parallel connections at first end positions of memory blocks disposed in associated columns;
    c) a source line shared between said plurality of memory blocks and coupled to parallel connections at second end positions of said plurality of memory blocks opposite to said first end positions;
    d) a plurality of first word lines respectively associated with said rows of said memory cells, and each of the plurality of first word lines being coupled to controlling gate electrodes of said memory transistors within an associated row, one of said first word lines being driven for selecting one of said memory cells from a selected memory block; and
    e) a plurality of second word lines respectively paired with said plurality of first word lines, and respectively associated with said rows of said memory cells, each of said plurality of second word lines being coupled to said switching transistors within an associated row, a second word line paired with said one of said first word lines being kept in an inactive level, the other second word lines associated with the other memory cells of said selected memory block being driven to an active level for allowing current to bypass the memory transistors associated therewith.

2. A non-volatile programmable read only memory device as set forth in claim 1, in which said memory cells are of an electrically erasable and programmable read only memory cell.

3. A non-volatile programmable read only memory device, as set forth in claim 2, in which each of said memory cells are fabricated on a semiconductor substrate of a first conductivity type, and comprises spaced impurity regions of a second conductivity type formed in a surface portion of said semiconductor substrate, a first gate oxide film covering said surface portion between said impurity regions, a floating gate electrode formed on said first gate oxide film and partially overlapped with at least one of said impurity regions, a second gate oxide film covering said floating gate electrode, and a controlling gate electrode formed on said second gate oxide film and electrically coupled to one of said first word lines.

4. A non-volatile programmable read only memory device as set forth in claim 3, wherein said non-volatile programmable read only memory device selectively enters an erasing phase, a write-in phase and a read-out phase of operation.

5. A non-volatile programmable read only memory device as set forth in claim 4, in which said erasing phase has a simultaneous erasing mode and a selective erasing mode.

6. A non-volatile programmable read only memory device as set forth in claim 5, in which said first word lines associated with emory cells to be simultaneously erased are regulated to a first voltage level different from an erased voltage level in said simultaneous erasing mode, and in which said second word lines associated with said memory cells to be simultaneously erased cause said switching transistors to turn on so that said erasing voltage level is supplied from either source line or the associated bit lines to said memory transistors incorporated in said memory cells to be simultaneously erased when said non-volatile programmable read only memory device enters said simultaneous erasing mode.

7. A non-volatile programmable read only memory device as set forth in claim 5, in which one of said first word lines associated with memory cells to be selectively erased is regulated to a first voltage level different from an erasing voltage level in said selective erasing mode, and in which the other first word lines associated with the memory cells not to be erased are regulated to a second voltage level equal to or closer to said erasing voltage level, wherein said second word lines associated with said memory cells cause said switching transistors to turn on so that said erasing voltage level is supplied from either the source line or the associated bit lines to said memory transistors when said non-volatile programmable read only memory device enters said simultaneous erasing mode.

8. A non-volatile programmable read only memory device, as set forth in claim 4, in which one of said first word lines associated with a memory cell to be written is regulated to a third voltage level capable of attracting hot carriers in said write-in phase, the other first word lines being regulated to a fourth voltage level hardly attracting said hot carriers, and in which one of said second word lines paired with said one of said first word lines maintains the associated switching transistors off, the other second word lines allowing said associated switching transistors to turn on so that a write-in voltage level is supplied to said memory cell to be written in said write-in phase.

9. A non-volatile programmable read only memory device as set forth in claim 4, in which one of said first word lines associated to a memory cell to be accessed is regulated to a read-out voltage level between a threshold level of an erased state and a threshold level of a write-in state, and in which said second word line paired with said one of said first word lines keeps the switching transistor off, the other second word lines causing the associated switching transistors to turn on so that a read-out current is supplied from the associated bit line to said memory cell to be accessed in said read-out phase.

10. A non-volatile programmable read only memory device as set forth in claim 3, in which said non-volatile programmable read only memory device further comprises f) a plurality of selecting transistors provided in association with said memory blocks, respectively, and coupled between said associated memory blocks and said associated bit lines, g) a plurality of third word lines coupled to rows of said selecting transistors, respectively, one of said third word lines allowing said selecting transistors coupled thereto to turn on in a read-out phase, a write-in phase and an erasing phase using said bit lines.

11. A non-volatile programmable read only memory device as set forth in claim 10, in which said memory cells in erased state are operative in a depletion mode.

* * * * *